(12) United States Patent
Lai et al.

(10) Patent No.: US 12,334,925 B2
(45) Date of Patent: Jun. 17, 2025

(54) PULSE WIDTH CONTROL APPARATUS AND METHOD

(71) Applicant: Taiwan Semiconductor Manufacturing Company, Ltd., Hsinchu (TW)

(72) Inventors: Yi-An Lai, Taipei (TW); Chan-Hong Chern, Palo Alto, CA (US); Cheng-Hsiang Hsieh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 35 days.

(21) Appl. No.: 18/366,991

(22) Filed: Aug. 8, 2023

(65) Prior Publication Data

US 2023/0396238 A1  Dec. 7, 2023

Related U.S. Application Data

(63) Continuation of application No. 17/836,046, filed on Jun. 9, 2022, now Pat. No. 11,764,760.

(60) Provisional application No. 63/329,942, filed on Apr. 12, 2022.

(51) Int. Cl.
*H03K 3/017* (2006.01)
*H03K 3/012* (2006.01)
*H03K 19/20* (2006.01)

(52) U.S. Cl.
CPC ............ *H03K 3/017* (2013.01); *H03K 3/012* (2013.01); *H03K 19/20* (2013.01)

(58) Field of Classification Search
None
See application file for complete search history.

(56) References Cited

U.S. PATENT DOCUMENTS

| 4,533,841 | A |   | 8/1985 | Konishi |
| 4,658,225 | A |   | 4/1987 | Dukes et al. |
| 5,030,852 | A | * | 7/1991 | Higashisaka ...... H03K 19/0952 |
|   |   |   |   | 326/116 |
| 6,538,465 | B1 |   | 3/2003 | Demone |

(Continued)

FOREIGN PATENT DOCUMENTS

| JP | H07264049 A | 10/1995 |
| JP | H08306796 A | 11/1996 |

(Continued)

OTHER PUBLICATIONS

Taiwan Office Action; Application No. 112109636; Dated Jun. 6, 2024.

(Continued)

*Primary Examiner* — Jeffrey S Zweizig
(74) *Attorney, Agent, or Firm* — Jones Day

(57) ABSTRACT

Systems, methods, and devices are described herein for generating a pulse width modulation (PWM) signal having a specific duty cycle. In one embodiment, the system includes a square wave generator and a logic device. The square wave generator is configured to delay a input square wave signal to generate a plurality of square wave signals. The logic device is configured to perform a logic operation to two of square wave signals of the plurality of square wave signals, which in turn generates the PWM signal having a duty cycle corresponding to the two square wave signals.

20 Claims, 6 Drawing Sheets

(56) References Cited

U.S. PATENT DOCUMENTS

| | | | |
|---|---|---|---|
| 6,831,493 | B2 | 12/2004 | Ma |
| 7,365,661 | B2 | 4/2008 | Thomas |
| 8,653,854 | B2 * | 2/2014 | Spits ................ H03K 19/09445 |
| | | | 326/112 |
| 9,793,811 | B2 | 10/2017 | Noh et al. |
| 10,404,251 | B2 | 9/2019 | Chen et al. |
| 10,651,852 | B1 * | 5/2020 | Whitney ............. H01L 27/0285 |
| 11,081,578 | B2 | 8/2021 | Udrea et al. |
| 11,201,613 | B2 | 12/2021 | Tsai |
| 2020/0350863 | A1 | 11/2020 | Jurkov et al. |

FOREIGN PATENT DOCUMENTS

| | | |
|---|---|---|
| JP | 11-138893 A | 5/1999 |
| JP | 2006506937 A | 2/2006 |
| JP | 2012530442 A | 11/2012 |
| KR | 20200014220 A | 2/2020 |

OTHER PUBLICATIONS

Japanese Office Action; Application No. 2023-057291; Dated Mar. 12, 2024.
1 Japanese Office Action; Application No. 2023-057291; Dated Aug. 13, 2024.
Korean Office Action; Application No. 10-2022-0097794; Dated Nov. 22, 2023.
Korean Notice of Allowance; Application No. 10-2022-0097794; Dated Jul. 4, 2024.

\* cited by examiner

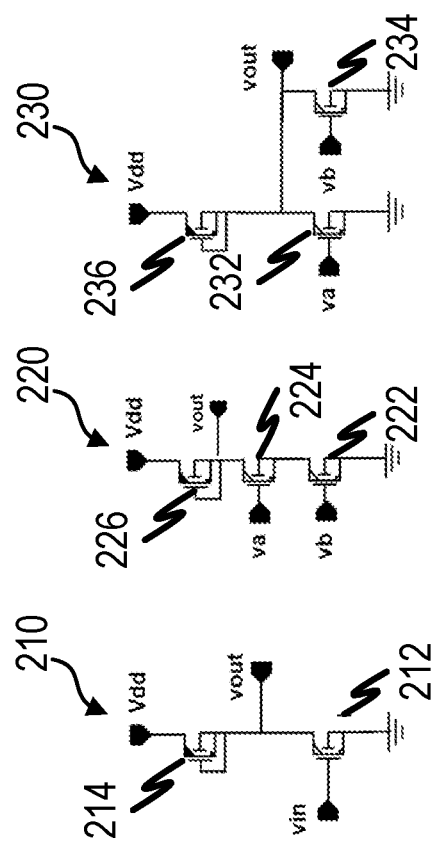

PULSE WIDTH CONTROL APPARATUS AND METHOD

PRIORITY CLAIM

This application is a continuation of U.S. patent application Ser. No. 17/836,046, filed on Jun. 9, 2022, which claims priority to U.S. Provisional Application No. 63/329,942, filed on Apr. 12, 2022, the contents of which are incorporated herein by reference in their entirety.

BACKGROUND

High-side integrated driver circuits implemented by Gallium Nitride (GaN) High Electron Mobility Transistors (HEMT) enable high-power throughput of various circuitry. HEMTs have a variety of applications including drive operations of discrete power transistors.

BRIEF DESCRIPTION OF THE DRAWINGS

Aspects of the present disclosure are best understood from the following detailed description when read with the accompanying figures:

FIG. 2A is an electrical schematic illustrating an example logic circuit in accordance with various embodiments of the present disclosure.

FIG. 2B is an electrical schematic illustrating another example logic circuit in accordance with various embodiments of the present disclosure.

FIG. 2C is an electrical schematic illustrating another example logic 230 circuit in accordance with various embodiments of the present disclosure.

DETAILED DESCRIPTION

Figure 1:
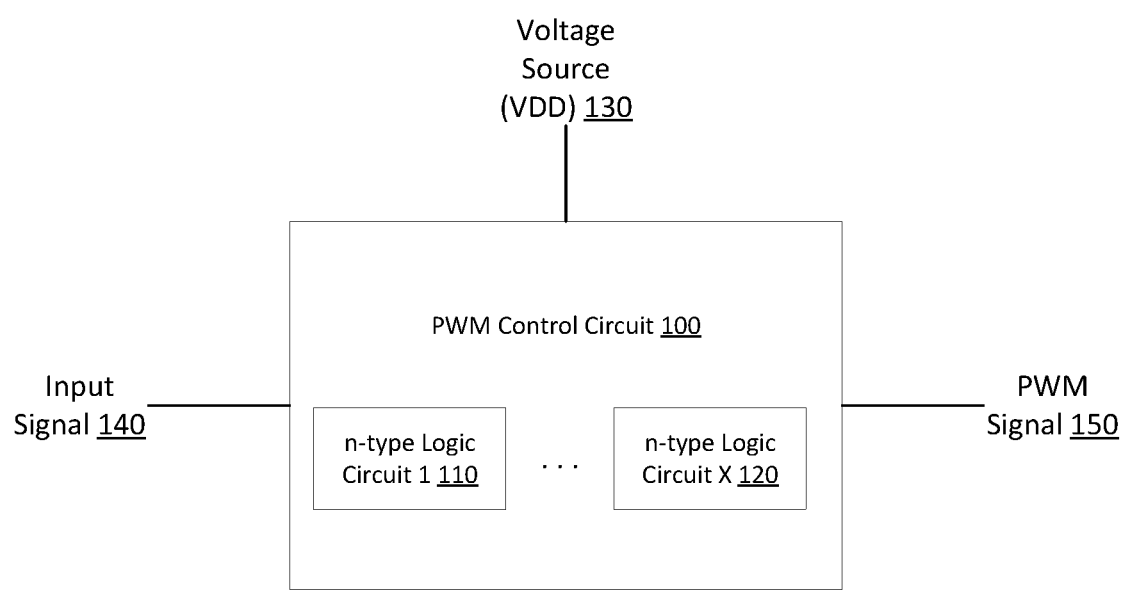
FIG. 1 is a block diagram illustrating an example PWM control circuit in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Field-effect transistors (FETs) are transistors that operate an electrical device using an electric field. HEMTs, such as Gallium Nitride (GaN) HEMTs, are a type of FET. Due in part to high current density, high breakdown voltage, and low operational resistance, HEMTs are suitable for use in high-power applications. HEMTs, such as GaN HEMTs, have a variety of useful applications including use in pulse width modulation (PWM) control circuits as described herein. PWM circuits are often used to reduce amounts of power consumed by an integrated circuit (IC).

GaN HEMTs are capable of delivering large amounts of power because of their unique combination of material characteristics including low resistance, high breakdown fields, wide bandgaps (e.g., 3.36 eV for GaN at room temperature), high current density, large conduction band offset, and/or high saturated electron drift velocity. Typically, PWM circuits contain one or more logic circuits having both p-type HEMTs and n-type HEMTs. These PWM circuits, however, can still experience power loss, be large in size, and or costly due to the number of electrical components therein.

Figure 4:
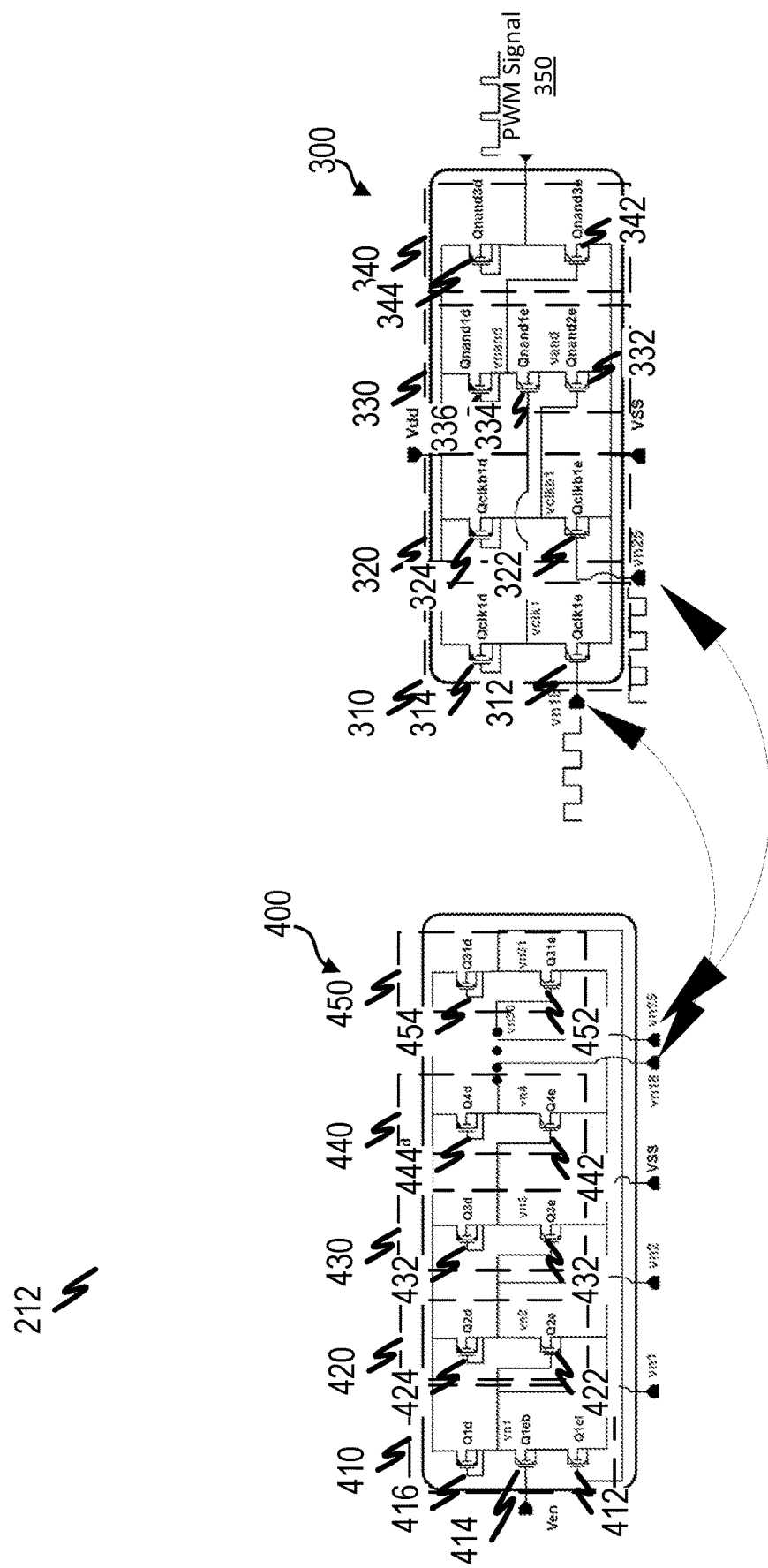
FIG. 4 is an example schematic illustrating an oscillator providing input voltages to the PWM control circuit in accordance with various embodiments of the present disclosure.

The circuits and methods described herein utilize only n-type HEMTs to implement logic circuitry, which in turn can generate PWM signals with minimal to no power loss. For example, FIG. 1 is a block diagram illustrating an example PWM control circuit 100 in accordance with various embodiments of the present disclosure. The PWM control circuit 100 can, in some embodiments, be a GaN PWM control circuit made up of GaN integrated circuits such as HEMTs. The PWM control circuit 100 can include any number of n-type logic circuits such as n-type logic circuit 1 110 and n-type logic circuit X 120. A single voltage source (e.g., power supply) VDD 130 powers PWM control circuit 100. An input signal 140, such as voltage from an oscillator circuit as described in more detail in FIG. 4, is provided to the PWM control circuit 100. The combination of n-type logic circuits (e.g., n-type logic circuit 110 and n-type logic circuit X 120) utilize the input signal 140 to generate an output PWM signal 150 with varying duty cycles. The duty cycle width can be controlled by input signal 140.

FIGS. 2A-2C are electrical schematics illustrating example logic circuits 210, 220, 230 for integration in PWM control circuit 100 of FIG. 1 in accordance with various embodiments of the present disclosure. In some embodiments, logic circuits 210, 220, 230 are made up of GaN components. For example, FIG. 2A is an electrical schematic illustrating an example logic 210 circuit in accordance with various embodiments of the present disclosure. Logic circuit 210 is a NOT gate takes its input value and outputs an inverted value of the input value.

Logic circuit 210 is made up of an enhancement mode HEMT (E-HEMT) 212 and a depletion mode HEMT (D-HEMT) 214 coupled together in series. E-HEMTs and D-HEMTs are example n-type HEMTs. An E-HEMT requires a positive gate voltage to attract electrons towards the gate or an appropriate doping level in a neighboring barrier to attract electrons toward the gate. Electrons attracted toward the gate and enable current flow within the E-HEMT. In other words, an E-HEMT is turned on or activated by pulling the gate terminal thereof to a voltage level higher than a level of a threshold voltage, Vth. Conversely, a D-HEMT is in an on state at a zero gate-source voltage. In other words, a D-HEMT is in an on state at the zero gate-source voltage and turns off when a negative gate voltage is applied. As such, it has a negative threshold voltage (e.g., −1.0V). Turning back to FIG. 2A, a source/drain terminal of the D-HEMT 214 is coupled to a voltage source, Vdd, (e.g., voltage source 130). Another source/drain terminal of D-HEMT 214 as well as the gate terminal of D-HEMT 214 are coupled to a source/drain terminal of E-HEMT 212. It is at this node, where an output voltage, vout, is provided by logic circuit 210. A gate terminal of E-HEMT 212 is coupled to an input voltage, yin. Another source/drain terminal of the E-HEMT 212 is coupled to electrical ground.

In operation, when the input voltage, yin, is a positive voltage level, the E-HEMT 212 is turned on or activated and operates as a resistor. At this time, the D-HEMT 214 is turned off or deactivated. In a subsequent operation, when the input voltage, yin, is approximately zero, the E-HEMT 212 is turned off or inactive. At this time, the D-HEMT 214 is turned on or activated and operates as a resistor.

FIG. 2B is an electrical schematic illustrating another example logic 220 circuit in accordance with various embodiments of the present disclosure. Logic circuit 220 is a NAND gate takes its input value and outputs a logic low (e.g., '0') only if all its inputs are logic highs (e.g., '1'). Otherwise, the NAND gate outputs a logic high (e.g., '1'). Logic circuit 220 is made up of two E-HEMTs 222, 224 and a D-HEMT 226 coupled together in series. A source/drain terminal of the D-HEMT 226 is coupled to a voltage source, Vdd, (e.g., voltage source 130). Another source/drain terminal of D-HEMT 226 as well as the gate terminal of D-HEMT 226 are coupled to a source/drain terminal of E-HEMT 224. It is at this node, where an output voltage, vout, is provided by logic circuit 220. A gate terminal of E-HEMT 224 is coupled to a first input voltage, va. Another source/drain terminal of the E-HEMT 224 is coupled to a source/drain terminal of E-HEMT 222. A gate terminal of E-HEMT 222 is coupled to a second voltage source, vb. Another source/drain terminal of E-HEMT 222 is coupled to ground.

In operation, when the first input voltage, va, is a positive voltage level, the E-HEMT 224 is turned on/activated and operates as a resistor. Similarly, when the second input voltage, vb, is a positive voltage level, the E-HEMT 222 is turned on or activated and acts as a resistor. When either E-HEMT 222 or E-HEMT 224 are turned on or activated, the D-HEMT 226 is turned off or deactivated. In a subsequent operation, when the first input voltage, va, is approximately zero, the E-HEMT 224 is turned off or deactivated. Similarly, when the second input voltage, vb, is approximately zero, the E-HEMT 222 is turned off or deactivated. When either of the E-HEMT 222 or E-HEMT 224 are turned off or deactivated, the D-HEMT 226 is turned on or activated and operates as a resistor.

FIG. 2C is an electrical schematic illustrating another example logic 230 circuit in accordance with various embodiments of the present disclosure. Logic circuit 230 is a NOR gate takes its input value and outputs a logic high (e.g., '1') only if all its inputs are logic lows (e.g., '0'). Otherwise, the NOR gate outputs a logic low (e.g., '0'). Logic circuit 230 is made up of two E-HEMTs 232, 234 and a D-HEMT 236. E-HEMTs 232, 234 are coupled together in parallel. The D-HEMT 236 is coupled to the E-HEMT 232 in series. A source/drain terminal of the D-HEMT 236 is coupled to a voltage source, Vdd, (e.g., voltage source 130). Another source/drain terminal of D-HEMT 236 as well as the gate terminal of D-HEMT 236 are coupled to a source/drain terminal of each of E-HEMT 232 and E-HEMT 234. It is at this node, where an output voltage, vout, is provided by logic circuit 230. A gate terminal of E-HEMT 232 is coupled to a first input voltage, va. Another source/drain terminal of the E-HEMT 232 is coupled to a ground. A gate terminal of E-HEMT 234 is coupled to a second voltage source, vb. Another source/drain terminal of E-HEMT 234 is coupled to ground.

In operation, when the first input voltage, va, is a positive voltage level, the E-HEMT 232 is turned on/activated and operates as a resistor. Similarly, when the second input voltage, vb, is a positive voltage level, the E-HEMT 234 is turned on or activated and acts as a resistor. When either E-HEMT 232 or E-HEMT 234 are turned on or activated, the D-HEMT 236 is turned off or deactivated. In a subsequent operation, when the first input voltage, va, is approximately zero, the E-HEMT 232 is turned off or deactivated. Similarly, when the second input voltage, vb, is approximately zero, the E-HEMT 234 is turned off or deactivated. When either of the E-HEMT 232 or E-HEMT 234 are turned off or deactivated, the D-HEMT 236 is turned on or activated and operates as a resistor.

Figure 3A:
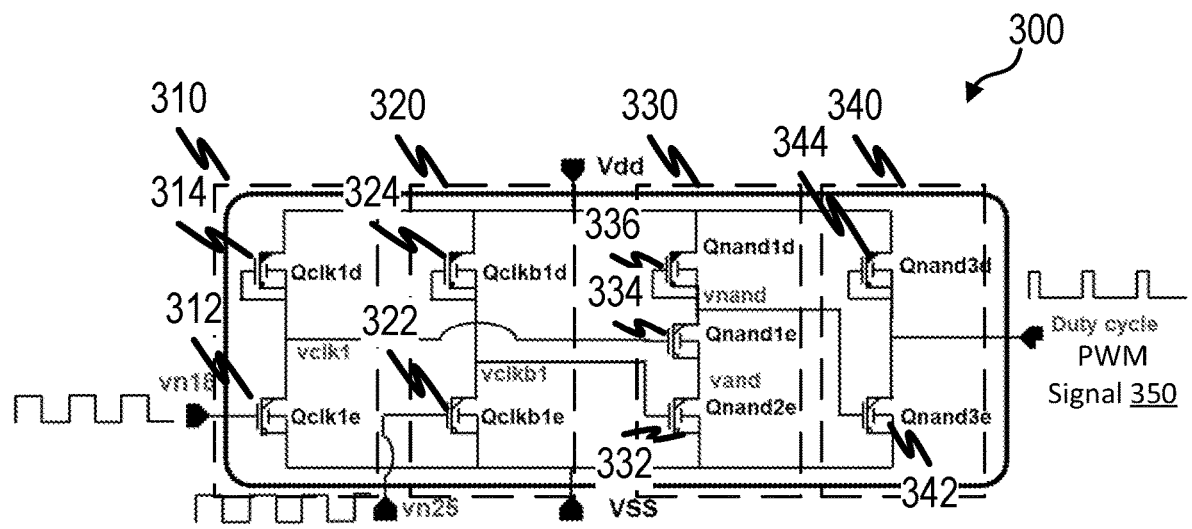
FIG. 3A is an example PWM control circuit in accordance with various embodiments of the present disclosure.

FIG. 3A is an example PWM control circuit 300 in accordance with various embodiments of the present disclosure. The PWM control circuit 300, in some embodiments, is a GaN device having GaN components. For example, PWM control circuit 300 includes a number of logic circuits 310, 320, 330, 340 that are fully integrated in a GaN chip. Logic circuits 310, 320, and 340 are NOT gates each having substantially equivalent components, couplings, and operations as previously described in FIG. 2A. In other words, logic circuit 310 includes an E-HEMT 312 and a D-HEMT 314, where D-HEMT 314 is substantially equivalent to D-HEMT 214 and E-HEMT 312 is substantially equivalent to E-HEMT 212. Similarly, logic circuit 320 includes an E-HEMT 322 and a D-HEMT 324, where D-HEMT 324 is substantially equivalent to D-HEMT 214 and E-HEMT 322 is substantially equivalent to E-HEMT 212. Likewise, logic circuit 340 includes an E-HEMT 342 and a D-HEMT 344, where D-HEMT 344 is substantially equivalent to D-HEMT 214 and E-HEMT 342 is substantially equivalent to E-HEMT 212.

Logic circuit 330 is a NAND gate having substantially equivalent components, couplings, and operations as previously described in FIG. 2B. In other words, logic circuit 330 includes E-HEMTs 332, 334 and a D-HEMT 336, where E-HEMT 332 is substantially equivalent to E-HEMT 222, E-HEMT 334 is substantially equivalent to E-HEMT 224, and D-HEMT 336 is substantially equivalent to D-HEMT 226.

Logic circuits 310, 320 provide input voltages vclk1 and vclkb1, respectively, to logic circuit 330. In turn, logic circuit 330 provides an input voltage vnand to logic circuit 340. Logic circuit 340 outputs a PWM signal 350 having a duty cycle based on the duty cycles of voltages input to logic circuit 310, 320. For example, logic circuit 310 is coupled to logic circuit 330 and provides an output voltage (e.g., vclk1) via a node coupling E-HEMT 312 and D-HEMT 314 to a gate terminal of E-HEMT 334 of logic circuit 330 (e.g., input voltage va of logic circuit 220). Logic circuit 320 is also coupled to logic circuit 330 and provides an output voltage (e.g., vclk2) via a node coupling E-HEMT 322 and D-HEMT 324 to a gate terminal of E-HEMT 332 of logic circuit 300 (e.g., input voltage vb of logic circuit 220). Logic circuits 310, 320 each receive an input voltage (e.g., input voltage yin of circuit 210) vn18, vn25, respectively, from an external voltage source. Logic circuit 330 outputs an output voltage (e.g., output voltage vout of logic circuit 220) to a gate terminal of E-HEMT 342 of logic circuit 340. Logic circuit 340 in turn outputs a PWM signal 150 that is based on the duty cycles of input voltages vn18, vn25 of logic circuits 310, 320, respectively.

Figure 3B:
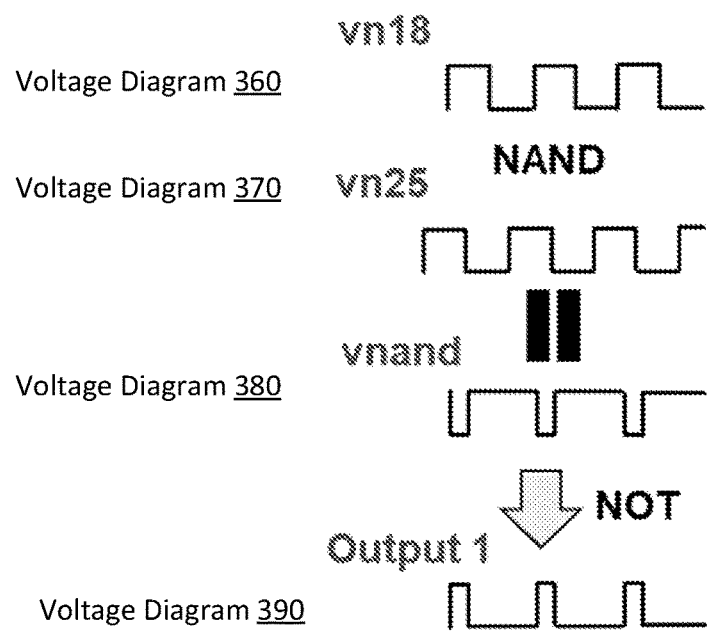
FIG. 3B is a series of voltage diagrams illustrating the operation of PWM control circuit over time in accordance with various embodiments of the present disclosure.

FIG. 3B is a series of voltage diagrams 360, 370, 380, 390 illustrating the operation of PWM control circuit 300 over time in accordance with various embodiments of the present disclosure. The voltages illustrated in voltage diagrams 360, 370, 380, 390 are for illustrative purposes and demonstrate voltage as a function of time with logic amplitudes of a logic high (e.g., '1') or a logic low (e.g., '0'). Voltage diagram 360 illustrates an input voltage vn18 to logic circuit 310 having a duty cycle (e.g., ratio of the pulse width to the period) of approximately 40%-50%. Voltage diagram 370 illustrates an input voltage vn25 to logic circuit 320 having a duty cycle of approximately 40%-50%. As previously discussed, input voltages vn18 and vn25 are provided by one or more external voltage sources. The two input voltages v18 and vn25 are combined together using a NAND logic operation via logic circuit 330. Voltage diagram 380 illustrates the output voltage vnand of logic circuit 330. As previously discussed, a NAND gate takes its input value and outputs a logic low (e.g., '0') only if all its inputs are logic highs (e.g., '1'). Otherwise, the NAND gate outputs a logic high (e.g., '1'). This operation is illustrated in voltage diagram 380. Voltage diagram 390 illustrates the PWM signal 350 output by logic gate 330. The voltage diagram 390 is an inverted version of voltage diagram 380, as logic gate 330 performs the logic operation of NOT, which inverts the input voltage. The duty cycle associated with voltage diagram 390 is approximately 10%-15%.

FIG. 4 is an example schematic illustrating an oscillator 400 providing input voltages vn18, v25 to the PWM control circuit 300 in accordance with various embodiments of the present disclosure. Input voltages vn18, vn25 can be provided by an external power source, such as an oscillator. Oscillator 400 includes a number of logic circuits 410, 420, 430, 440, 450 as well as additional logic circuits not illustrated in FIG. 4 that are used to generate voltages vn18, vn25. Logic circuit 410 is a NAND gate having substantially equivalent components, couplings, and operations as previously described in FIG. 2B. In other words, logic circuit 410 includes E-HEMTs 412, 414 and a D-HEMT 416, where E-HEMT 412 is substantially equivalent to E-HEMT 222, E-HEMT 414 is substantially equivalent to E-HEMT 224, and D-HEMT 416 is substantially equivalent to D-HEMT 226. Logic circuits 420, 430, 440, 450 are each NOT gates each having substantially equivalent components, couplings, and operations as previously described in FIG. 2A. In other words, logic circuit 420 includes an E-HEMT 422 and a D-HEMT 424, where D-HEMT 424 is substantially equivalent to D-HEMT 214 and E-HEMT 422 is substantially equivalent to E-HEMT 212. Similarly, logic circuit 430 includes an E-HEMT 432 and a D-HEMT 434, where D-HEMT 434 is substantially equivalent to D-HEMT 214 and E-HEMT 432 is substantially equivalent to E-HEMT 212. Likewise, logic circuit 440 includes an E-HEMT 442 and a D-HEMT 444, where D-HEMT 444 is substantially equivalent to D-HEMT 214 and E-HEMT 442 is substantially equivalent to E-HEMT 212. Correspondingly, logic circuit 450 includes an E-HEMT 452 and a D-HEMT 454, where D-HEMT 454 is substantially equivalent to D-HEMT 214 and E-HEMT 452 is substantially equivalent to E-HEMT 212.

Logic circuit 410 receives a first input voltage, Ven, (e.g., va of logic circuit 220), at a gate terminal of E-HEMT 414. Logic circuit 420 also received a second input voltage, vn31, (e.g., vb of logic circuit 220) output from logic circuit 450 at a gate terminal of E-HEMT 412. Logic circuit 410 is coupled to logic circuit 420 and provides its output voltage vn1 (e.g., vout of logic circuit 220) to a gate terminal of E-HEMT 422 (e.g., yin of logic circuit 210). Logic circuit 420 is coupled to logic circuit 430 and provides its output voltage vn2 (e.g., vout of logic circuit 210) to a gate terminal of E-HEMT 432 (e.g., yin of logic circuit 210). Logic circuit 430 is coupled to logic circuit 440 and provides its output voltage vn3 (e.g., vout of logic circuit 210) to a gate terminal of E-HEMT 440 (e.g., yin of logic circuit 210). Similarly, logic circuit 440 is coupled to another series of logic circuit not illustrated in FIG. 4 and is represented by series of continuing dots and provides its output voltage v4 (e.g., vout of logic circuit 210) to the next coupled logic circuit. Such a series of logic circuits continues until logic circuit 450. Logic circuit 450 is coupled to a logic circuit not illustrated in FIG. 4 and receives an input voltage vn30 at a gate terminal of E-HEMT 452. Logic circuit 450 is coupled to logic circuit 410, as previously discussed, and provides a voltage vn30 (e.g., vout of logic circuit 210). Based on the desired input waveform characteristics for PWM control circuit 300, voltages from the oscillator 400 can be provided at various connection points on the series of logic circuits within oscillator 400. For example, voltages vn18 and vn25 can be taken from an eighteenth and twenty-fifth logic circuit, respectively, within oscillator 400. Such voltages can be provided to PWM control circuit 300 as described in detail in FIGS. 3A-3B.

It can be appreciated by those of ordinary skill in the art, however, that oscillator 400 is merely one example circuit that can provide voltage and any voltage source can be utilized to generate and provide voltage to PWM control circuit 300. Additionally, the component makeup of an oscillator can differ from that illustrated in FIG. 4.

Figure 5A:
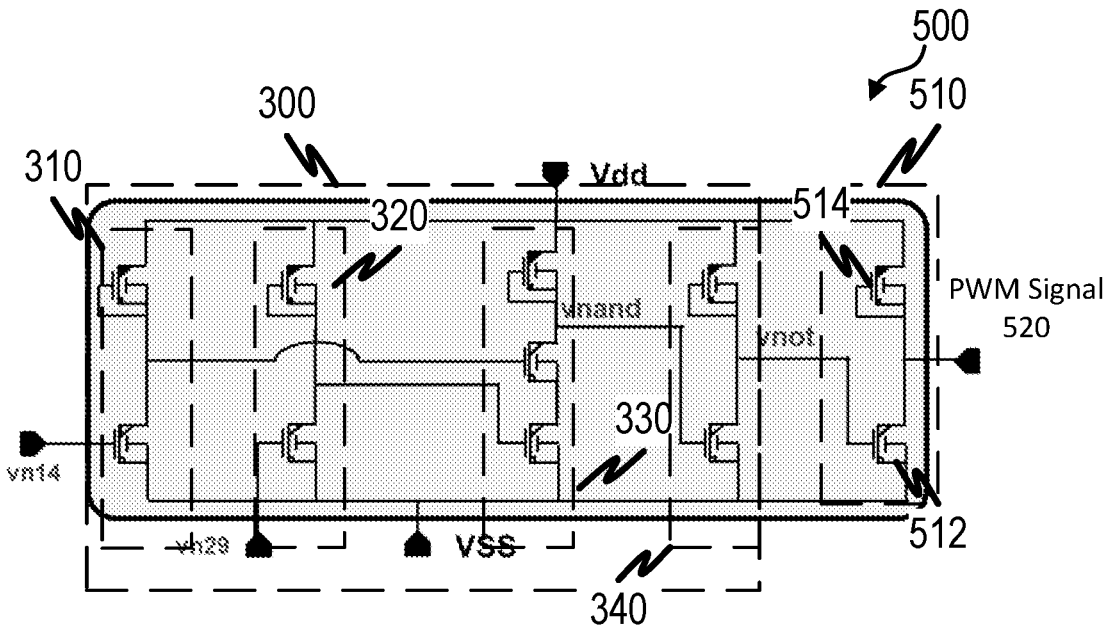
FIG. 5A is another example PWM control circuit in accordance with various embodiments of the present disclosure.

FIG. 5A is another example PWM control circuit 500 in accordance with various embodiments of the present disclosure. PWM control circuit 500 can have similar components as PWM control circuit 300, with an additional logic circuit 510 coupled thereto. The PWM control circuit 500, in some embodiments, is a GaN device having GaN components. Logic circuit 510 is a NOT gate having substantially equivalent components, couplings, and operations as previously described in FIG. 2A. In other words, logic circuit 510 includes an E-HEMT 512 and a D-HEMT 514, where D-HEMT 514 is substantially equivalent to D-HEMT 214 and E-HEMT 512 is substantially equivalent to E-HEMT 212. Logic circuit 510 receives an input voltage vnot (e.g., yin of logic circuit 210) from PWM control circuit 300 and outputs a PWM signal 520 at a source/drain terminal coupling point of E-HEMT 512 and D-HEMT 514. In the embodiment illustrated in FIG. PWM control circuit 500 receives different input voltages vn14, vn29 from an external voltage source, rather than vn18, vn25 as described in FIG. 3A. These external voltages can be supplied, in some embodiments, from serial logic circuits of oscillator 400 of FIG. 4.

Figure 5B:
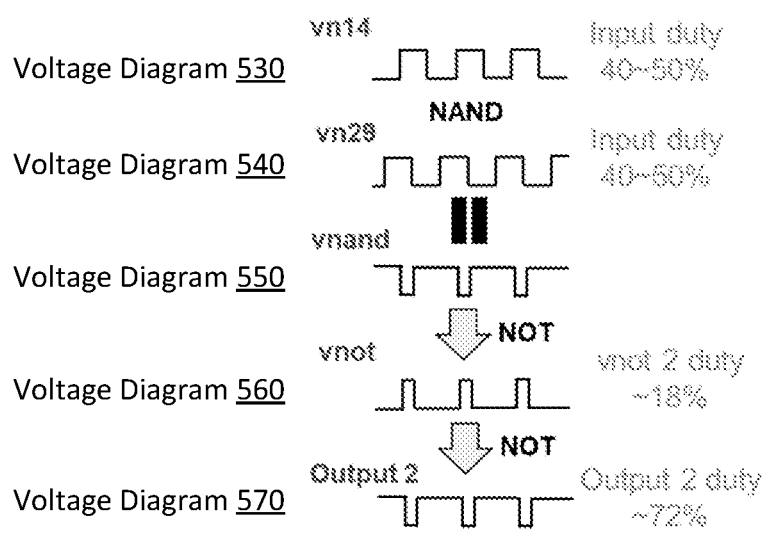
FIG. 5B is a series of voltage diagrams illustrating the operation of PWM control circuit over time in accordance with various embodiments of the present disclosure.

FIG. 5B is a series of voltage diagrams 530, 540, 550, 560, 570 illustrating the operation of PWM control circuit 500 over time in accordance with various embodiments of the present disclosure. The voltages illustrated in voltage diagrams 530, 540, 550, 560, 570 are for illustrative purposes and demonstrate voltage as a function of time with logic amplitudes of a logic high (e.g., '1') or a logic low (e.g., '0'). Voltage diagram 530 illustrates an input voltage vn14 to logic circuit 310 having a duty cycle (e.g., ratio of the pulse width to the period) of approximately 40%-50%. Voltage diagram 540 illustrates an input voltage vn29 to logic circuit 320 having a duty cycle of approximately 40%-50%. As previously discussed, input voltages vn14 and vn29 are provided by one or more external voltage sources. The two input voltages v14 and vn29 are combined together using a NAND logic operation via logic circuit 330. Voltage diagram 550 illustrates the output voltage vnand of logic circuit 330. As previously discussed, a NAND gate takes its input value and outputs a logic low (e.g., '0') only if all its inputs are logic highs (e.g., '1'). Otherwise, the NAND gate outputs a logic high (e.g., '1'). This operation is illustrated in voltage diagram 550. Voltage diagram 560 illustrates an output voltage vnot of logic circuit 340. The voltage diagram 560 is an inverted version of voltage diagram 550, as logic gate 330 performs the logic operation of NOT, which inverts the input voltage. The duty cycle associated with voltage diagram 560 is approximately 15%-20%. Voltage diagram 570 illustrates the PWM signal 550 output by logic gate 510. The voltage diagram 570 is an inverted version of voltage diagram 560, as logic gate 510 performs the logic operation of NOT, which inverts the input voltage. The duty cycle associated with voltage diagram 560 is approximately 70%-75%.

Figure 6:
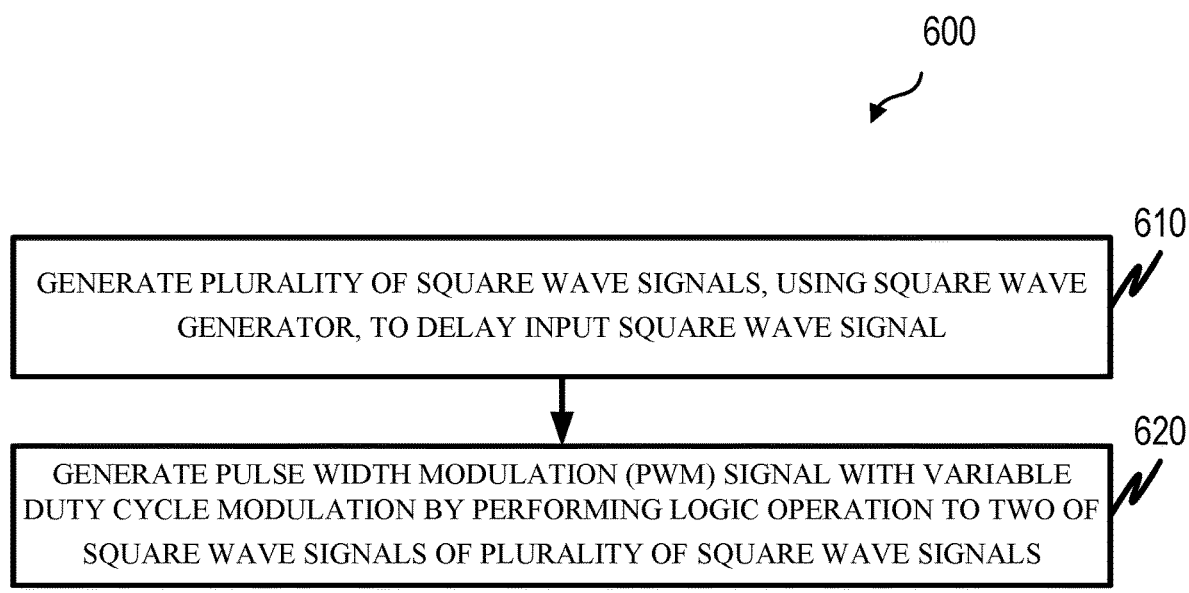
FIG. 6 is a process flow diagram illustrating method of generating a PWM signal in accordance with various embodiments of the present disclosure.

FIG. 6 is a process flow diagram 600 illustrating method of generating a PWM signal in accordance with various embodiments of the present disclosure. While FIG. 6 is described here with reference to previously described structures for ease in understanding, it is understood that the method applies to many other structures as well. A plurality of square wave signals (e.g., vn1, vn2, vn3, vn4, vn14, vn18, vn25, vn29, vn30, vn31 of oscillator 400) are generated at step 610, using a square wave generator such as oscillator 400, to delay an input square wave signal (e.g., Ven). A PWM signal such as PWM signals 350, 520 are generated at step 620 with variable duty cycle modulation (e.g., voltage diagram 390 v. voltage diagram 570) by performing a logic operation (e.g., NOT, NOR, or NAND) to two of square wave signals (e.g., vn14, vn18 and/or vn25, vn29) of the plurality of square wave signals (e.g., vn1, vn2, vn3, vn4, vn14, vn18, vn25, vn29, vn30, vn31 of oscillator 400).

Use of the various circuits and methods as described herein can provide a number of advantages. For example, the various circuits and methods described herein does not require a sawtooth generator, level shifter, or comparator to provide an input voltage to the PWM control circuits. Additionally, the circuits and methods provide for a fully integrated design that reduces switching loss from assembled complementary metal-oxide-semiconductor (CMOS) control integrated circuit (IC) and GaN power device. Additionally, the circuits and methods described herein do not require additional passive components, thereby improving performance and minimizing the size of the device.

In one embodiment, a system includes a square wave generator and a logic device. The square wave generator is configured to delay a input square wave signal to generate a plurality of square wave signals. The logic device is configured to perform a logic operation to two of square wave signals of the plurality of square wave signals that in turn generates a PWM signal having a duty cycle corresponding to the two square wave signals.

In another embodiment, a device includes a plurality of logic circuits comprising a plurality of E-HEMTs and a plurality of D-HEMTs. The plurality of logic circuits are configured to generate a PWM signal based on voltage inputs to the plurality of logic circuits.

In yet another embodiment, a plurality of square wave signals are generated, using a square wave generator, to delay an input square wave signal. A PWM signal is generated with variable duty cycle modulation by performing a logic operation to two of square wave signals of the plurality of square wave signals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system comprising:
a logic device configured to perform a logic operation to two of signals generated by an oscillator circuit, wherein the logic operation generates a pulse width modulation (PWM) signal having a duty cycle corresponding to the two signals and the logic device comprises:
first and second logic circuits configured to receive the two signals; and
a third logic circuit configured to output the PWM signal.

2. The system of claim 1, wherein the logic device comprises a plurality of enhancement mode high electron mobility transistors (E-HEMTs) and a plurality of depletion mode high electron mobility transistors (D-HEMTs).

3. The system of claim 1, wherein:
the first logic circuit is configured to receive a first signal of the two signals, the first logic circuit comprising a first E-HEMT coupled in series to a first D-HEMT;
the second logic circuit is configured to receive a second signal of the two signals, the second logic circuit comprising a second E-HEMT coupled in series to a second D-HEMT;
the logic device further comprises a fourth logic circuit coupled to the first logic circuit and the second logic circuit, the fourth logic circuit comprising a third E-HEMT and a fourth E-HEMT coupled together in series with a third D-HEMT; and the third logic circuit is coupled to the fourth logic circuit, the third logic circuit comprising a fifth E-HEMT and a fourth D-HEMT.

4. The system of claim 3, wherein the logic device further comprises a fifth logic circuit coupled between the third logic circuit and the fourth logic circuit, the fifth logic circuit comprising a sixth E-HEMT and a fifth D-HEMT.

5. The system of claim 2, wherein the plurality of E-HEMTs and the plurality of D-HEMTs are n-type transistors.

6. The system of claim 1, wherein the logic operation comprises at least one of a NOT gate, a NAND gate, or a NOR gate.

7. The system of claim 1, further comprising a signal generator configured to delay an input signal to generate the signals, and the signal generator comprises the oscillator circuit.

8. The system of claim 1, wherein the logic device comprises Gallium Nitride (GaN) components.

9. A device comprising:
a plurality of logic circuits comprising a plurality of high electron mobility transistors (HEMTs), the plurality of logic circuits configured to generate a pulse width modulation (PWM) signal based on signals generated by an oscillator circuit and to the plurality of logic circuits, wherein the plurality of logic circuits comprise:
first and second logic circuits configured to receive the signals; and
a third logic circuit configured to output the PWM signal.

10. The device of claim 9, wherein the signals to the plurality of logic circuits comprise at least two signals generated by a signal generator and the PWM signal has a duty cycle signal that is based on duty cycles of the at least two signals.

11. The device of claim 9, wherein:
the first logic circuit is configured to receive a first signal of the signals, the first logic circuit comprising a first E-HEMT (enhancement-HEMT) of the plurality of E-HEMTs coupled in series to a first D-HEMT (depletion-HEMT) of the plurality of D-HEMTs;
the second logic circuit is configured to receive a second signal of the signals, the second logic circuit comprising a second E-HEMT of the plurality of E-HEMTs coupled in series to a second D-HEMT of the plurality of D-HEMTs;
the plurality of logic circuits further comprise a fourth logic circuit coupled to the first logic circuit and the second logic circuit, the fourth logic circuit comprising a third E-HEMT and a fourth E-HEMT of the plurality of E-HEMTs coupled together in series with a third D-HEMT of the plurality of D-HEMTs; and
the third logic circuit is coupled to the fourth logic circuit, the third logic circuit comprising a fifth E-HEMT of the plurality of E-HEMTs and a fourth D-HEMT of the plurality of D-HEMTs.

12. The device of claim 11, wherein the plurality of logic circuits further comprises a fifth logic circuit coupled between the third logic circuit and the fourth logic circuit, the fifth logic circuit comprising a sixth E-HEMT of the plurality of E-HEMTs and a fifth D-HEMT of the plurality of D-HEMTs.

13. The device of claim 9, wherein the plurality of E-HEMTs and the plurality of D-HEMTs are n-type transistors.

14. The device of claim 9, wherein the plurality of logic circuits comprises at least one of a NOT gate, a NAND gate, or a NOR gate.

15. The device of claim 10, wherein the signal generator comprises the oscillator circuit.

16. The device of claim 9, wherein the plurality of logic circuits comprise Gallium Nitride (GaN) components.

17. A method, comprising:
generating a pulse width modulation (PWM) signal with variable duty cycle modulation by performing a logic operation to two signals generated by an oscillator circuit, wherein the PWM signal is generated by:
receiving, by a first logic circuit and a second logic circuit, the two signals; and
generating, by a third logic circuit, the PWM signal.

18. The method of claim 17, wherein the PWM signal is generated by:
generating, by the first logic circuit and a second logic circuit, clocking voltages configured to drive a fourth logic circuit;
performing, by the fourth logic circuit, a first logic operation to generate a first voltage output; and
generating, by the third logic circuit, the PWM signal by performing a second logic operation on the first voltage output.

19. The method of claim 18, wherein:
the first logic circuit comprises a first E-HEMT coupled in series to a first D-HEMT;
the second logic circuit comprises a second E-HEMT coupled in series to a second D-HEMT;
the fourth logic circuit is coupled to the first logic circuit and the second logic circuit and comprises a third E-HEMT and a fourth E-HEMT coupled together in series with a third D-HEMT; and
the third logic circuit is coupled to the fourth logic circuit and comprises a fifth E-HEMT and a fourth D-HEMT.

20. The method of claim 18, wherein the PWM signal is further generated by performing, by a fifth logic circuit coupled between the third logic circuit and the fourth logic circuit, a third logic operation.

* * * * *